(12) United States Patent
Chidambarrao et al.

(10) Patent No.: US 6,825,529 B2
(45) Date of Patent: Nov. 30, 2004

(54) STRESS INDUCING SPACERS

(75) Inventors: Dureseti Chidambarrao, Weston, CT (US); Omer H. Dokumaci, Wappingers Falls, NY (US); Bruce B. Doris, Brewster, NY (US); Jack A. Mandelman, Flat Rock, NC (US); Xavier Baie, Wavre (BE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/318,602

(22) Filed: Dec. 12, 2002

(65) Prior Publication Data

US 2004/0113217 A1 Jun. 17, 2004

(51) Int. Cl.[7] .......................... H01L 29/76; H01L 29/94; H01L 31/062; H01L 31/113; H01L 31/119
(52) U.S. Cl. ........................ 257/336; 257/344; 257/408
(58) Field of Search ................................ 257/336, 344, 257/408, 412

(56) References Cited

U.S. PATENT DOCUMENTS

| | | | |
|---|---|---|---|
| 5,677,232 A | * 10/1997 | Kim et al. | ................... 438/412 |
| 6,057,581 A | 5/2000 | Doan | |
| 6,075,262 A | 6/2000 | Moriuchi et al. | |
| 6,157,064 A | * 12/2000 | Huang | ......................... 257/344 |
| 6,194,748 B1 | * 2/2001 | Yu | .............................. 257/216 |
| 6,258,695 B1 | 7/2001 | Dunn et al. | |
| 6,277,683 B1 | * 8/2001 | Pradeep et al. | ............. 438/200 |
| 6,316,302 B1 | * 11/2001 | Cheek et al. | ................ 438/199 |
| 6,391,782 B1 | * 5/2002 | Yu | ............................... 438/696 |
| 6,512,273 B1 | * 1/2003 | Krivokapic et al. | ......... 257/369 |
| 6,524,901 B1 | * 2/2003 | Trivedi | ........................ 438/183 |
| 2002/0027254 A1 | * 3/2002 | Kwean | ........................ 257/382 |
| 2002/0076947 A1 | * 6/2002 | Li et al. | ...................... 438/788 |
| 2002/0197861 A1 | * 12/2002 | Van De Ven et al. | ........ 438/664 |

OTHER PUBLICATIONS

IEDM 2000 "Mechanical stress effect of etch–stop nitride and its impact on deep submicron transistor design", Ito et al., NEC Corporation, ppgs 10.7.01–10.7.4.

* cited by examiner

*Primary Examiner*—Tom Thomas
*Assistant Examiner*—Jesse A. Fenty
(74) *Attorney, Agent, or Firm*—Jay H. Anderson; Eugene I. Shkurko

(57) ABSTRACT

A substrate under tension and/or compression improves performance of devices fabricated therein. Tension and/or compression can be imposed on a substrate through selection of appropriate gate sidewall spacer material disposed above a device channel region wherein the spacers are formed adjacent both the gate and the substrate and impose forces on adjacent substrate areas. Another embodiment comprises compressive stresses imposed in the plane of the channel using SOI sidewall spacers made of polysilicon that is expanded by oxidation. The substrate areas under compression or tension exhibit charge mobility characteristics different from those of a non-stressed substrate. By controllably varying these stresses within NFET and PFET devices formed on a substrate, improvements in IC performance have been demonstrated.

1 Claim, 7 Drawing Sheets

1. Pattern Gate Stack

2. Apply Etch Stop Material

3. Apply Compressive SiN

4. Apply PFET Block Mask

5. Etch SiN from NFET

6. Apply Etchstop #2

STRESS INDUCING SPACERS

CROSS REFERENCES TO RELATED APPLICATIONS

U.S. patent application Ser. No. 10/318,600, entitled "Isolation Structures for Imposing Stress Patterns" filed concurrently herewith is assigned to the same assignee hereof and contains subject matter related, in certain respect, to the subject matter of the present application. The above-identified patent application is incorporated herein by reference.

BACKGROUND OF THE INVENTION

1. Technical Field of the Invention

This invention pertains to inventive methods of manufacturing a semiconductor device for improving device performance, and to the resulting unique high-performance device structure. In particular, this invention has improved charge mobility in FET devices by structurally imposing tensile and compression forces in a device substrate during device fabrication.

Within the field of semiconductor device design, it is known that mechanical stresses within the device substrate can modulate device performance. Individual stress tensor components affect device behavior of PFETs and NFETs differently. Previous improvements that utilized stress enhancements tended to focus on one or the other type of device outside of a practical performance environment, such as in an IC chip. In order to maximize the performance of both PFETs and NFETs within IC chips, the stress components need to be engineered and applied differently, yet simultaneously. The best stress design is tension in both directions for the nFET and compression in the longitudinal direction for the pFET along with tension in the transverse direction relative to channel current. In this invention we show a method and structure by which we can use spacers to introduce a longitudinal tensile stress for the nFET while at the same time applying a longitudinal compressive stress on the pFET device in a conventional FET structure, and selectively deposited layers on silicon-on-insulator ("SOI") structures. The longitudinal stress is induced along the same axis as the current, or charge, being carried in the channel. It may be more difficult to impose a stress in the transverse direction using spacers so we lose benefit from that direction. However, by virtue of the fact that we can move the stress inducing component closer to the device through the use of stress inducing spacers and layers, the modulation of stress can be improved relative to the isolation material or STI stress approach as suggested in the patent application identified above. One advantage of the method and structure of the present invention that it has provided a device performance improvement for both the nFET and pFET simultaneously.

2. Description of the Prior Art

Ito et al (IEDM, 2000) impose stress using an etch-stop nitride superlayer that is deposited after the device is completely constructed. Again, here the films have a built-in intrinsic biaxial stress which they modulated from compressive through tensile. They found that when the film is in tension the nFET performance is enhanced while that of the pFET's is degraded. They found the reverse for compression, namely NFET is degraded while the pFET is enhanced. They could not improve the performance of both the pFET and nFET simultaneously. Also, since the film is well above the device the stress translated down into the silicon will be somewhat lesser, particularly when compared to material that is adjacent to the device.

In the application identified above entitled "Isolation Structures for Imposing Stress Patterns", we showed how to modulate the stresses imposed on the silicon by isolation (the preferred example used STI). One of the embodiments advocates the use of materials with different intrinsic stress and coefficients of expansion mismatched in the appropriate regions of the nFETs and pFETs to modulate induced stresses. In another embodiment, we discussed how to add compressive stress by oxidation through openings in a nitride liner as needed for pFETs in the longitudinal direction, while retaining all the tensile stresses (in the transverse pFET direction and transverse+longitudinal nFET directions) from intrinsic and thermal mismatch properties. Prior to these two recent disclosures, all prior known solutions and methods using mechanical stress for device performance enhancement improved neither both nFETs and pFETs simultaneously nor taught the individual device isolation structures and methods of making them. In the present specification we leverage stress effects on devices using stress induced by spacers and by processing, e.g. oxidizing, a selectively deposited silicon isolation liner on SOI structures. We also show how to modulate the stresses for both pFETs and nFETs, which brings the stress effect much closer to the device.

SUMMARY OF THE INVENTION

In this invention we show methods and structures by which we have applied tensile stress for the NFET while at the same time applying a compressive longitudinal stress on the PFET device. The structures and methods of making each device individually is also unique. Other disclosed embodiments teach structures, and methods of formation, for selectively inducing strain in the channel of pMOSFETs by using a patterned and oxidized isolation liner. Particular embodiments of the present invention rely upon the volume expansion of a patterned and oxidized silicon liner in isolation regions, or spacers on gate sidewalls, to selectively induce appropriate strain in the channels of adjacent pMOSFETs. The oxidized silicon liner induces a bending moment in an SOI island, resulting in a compressive stress centered in the channel. The compressive stress on the longitudinal component of the PFET may be tuned by varying the thickness of the silicon liner or, in another embodiment, structures and methods of formation are illustrated by which patterned and oxidized spacers on the sidewalls of the active area are used to introduce a longitudinal compressive stress on the pFET device. Through the use of patterned oxidized spacers, the stress is applied closer to the device than is possible with STI fill alone, significantly improving the ability to modulate the stress. It is also shown that the structure of the invention has a negligible effect on stress induced on adjacent devices, where stress modification may not be desired.

The primary advantage of these methods and structures is that they have provided device performance improvement. Another advantage is the method for fabricating NFETs and PFETs simultaneously on a common substrate, wherein each device is designed to enhance performance using stress inducing spacers and isolation liners. A secondary advantage is the structure and method of building an individual device with enhanced performance provided via stress inducing spacers and liners.

It is an object of the present invention to provide device performance improvements for NFETs, PFETs, and for both NFETs and PFETs simultaneously. It is another object of the present invention to be readily integratible into present manufacturing processes. It is another object of the present invention to be manufacturable in bulk silicon, silicon-on-insulator ("SOI"), and strained silicon structures. It is yet another object of the present invention to provide improved devices that can be integrated into present processes cheaply for significant device performance improvements.

This invention comprises a spacer structure for an NFET device and for a PFET device. A spacer region for the NFET device contains therein a first spacer material which applies a first type of mechanical stress on the NFET device in a longitudinal direction. A spacer region for the PFET device applies an opposing mechanical stress on the PFET device in the same longitudinal direction. The spacer regions may comprise similar or different spacer materials. Typically, the mechanical stresses are either tensile or compressive.

In another aspect, this invention comprises a method for making NFET and PFET devices. This aspect incorporates the formation of spacer regions at the sidewalls of the NFET gate. Another spacer is formed on the sidewalls of the PFET gate. Spacer materials in these spacer regions are selected to apply a first type of mechanical stress on the NFET device in the longitudinal direction (same axis as the direction of the device's channel current) and another type of mechanical stress on the PFET device in the longitudinal direction.

In another aspect, the present invention comprises source and drain regions formed in a substrate. The substrate having a channel region between each of the source and drain regions. A gate region adjacent the channel region controls conduction through the channel region. Stress inducing spacer material adjacent selected sides of the gate region imparts stress, i.e. tension or compression, to at least the channel region of the substrate.

In another aspect, this invention comprises an IC chip comprising, and a method of making on the IC chip, a plurality of stressed SOI regions and a plurality of unstressed SOI regions for use in FET and/or device manufacturing. FET devices on the IC chip comprise a stress inducing layer only on the ends of the stressed SOI regions. The stress inducing layer is deposited as a separate IC fabrication step. This stress inducing layer is then exposed to a preselected agent, which may be, for example, a gas, that modifies, e.g. expands, the stress inducing layer which then propagates a longitudinal mechanical stress in the SOI regions.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
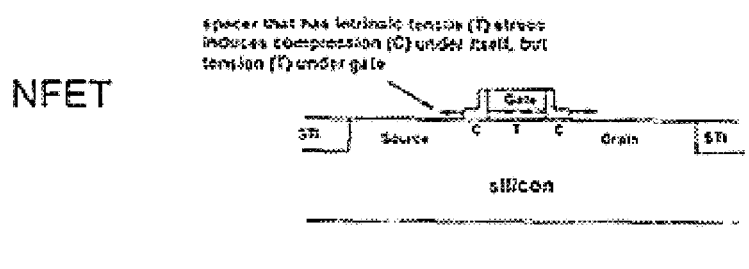
FIG. 1 illustrates cross-section views of a PFET and NFET showing desired stress states.

As shown in FIG. 1 below, wherein "C" indicates induced compression stresses in the substrate and "T" indicates induced tension stresses in the substrate, we wish to apply a longitudinal (in direction of channel current) tensile stress in the channel region under the gate for the nFET while applying a longitudinal compressive stress in the same region for the PFET. Stress inducing spacers are used, wherein the outward arrows from the gate sidewall on the NFET shows tensile spacer material, while the device body areas affected by the spacer material is labeled according to the induced stress effected there. Opposite effects are as shown in the PFET. We need to use spacers of the same intrinsic stress as is needed in the channel under the gate. While the induced stress would be relatively non-uniform and the length scale of their effects on the order of 3× the spacer thickness, since the spacer is now very close to the device, we expect the stress effect to play a significant role in device modulation. The key here is the process that allows two different spacers, one for the PFET and one for the NFET.

Figure 2:
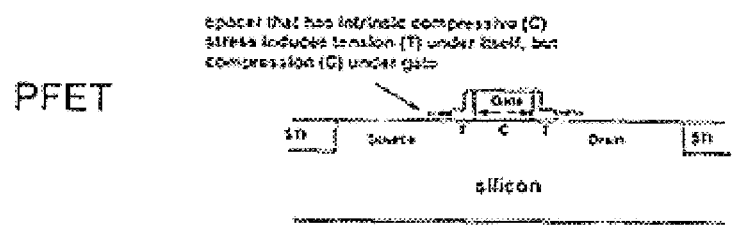
FIG. 2 illustrates a cross section view of a gate sidewall spacer structure.
Figure 2:
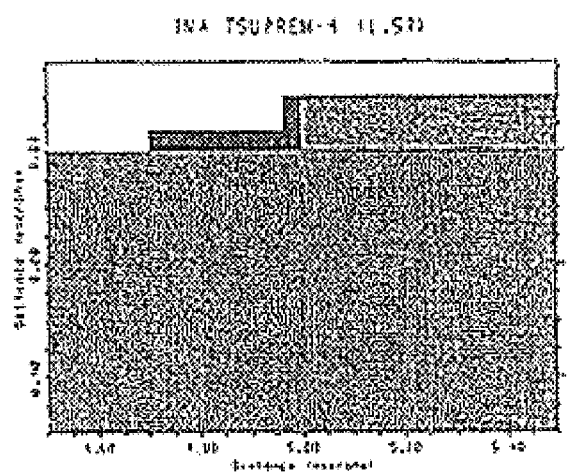
Figure 3:
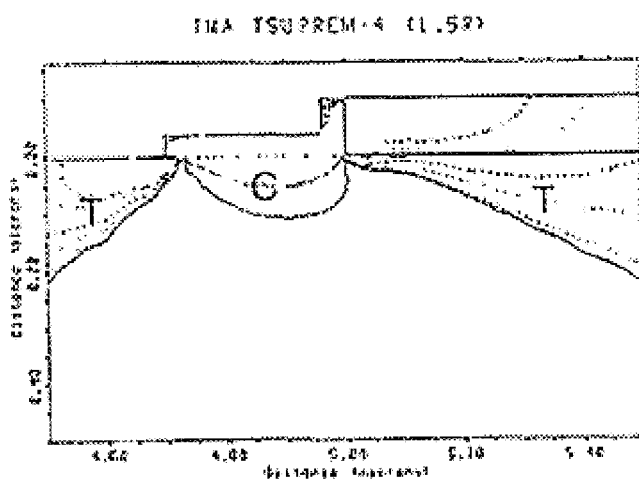
FIG. 3 illustrates stress contours induced by an intrinsically tensile spacer for the device outline of FIG. 2.

FIG. 2 illustrates a portion of the typical structure of an FET device depicted in FIG. 1. The bulk substrate region is shown in the bottom portion of the Figure, whereas the gate terminal is disposed on the substrate with a very thin oxide layer between it and the substrate. The spacer is the dark "L" shaped region adjacent both the substrate and the gate terminal. For the NFET device structure shown in FIG. 2, the longitudinal stress contours, indicating stress magnitude are given in FIG. 3 for the case where the spacer has an intrinsic tensile stress. The stress contour lines closer to the substrate top surface follow the contours of greater stress magnitude. This creates a tensile stress under the gate as desired. The transverse stress is also tensile for the same intrinsic tensile spacer stress, but is much smaller and can be neglected from a stress effect on device characteristic point of view. For the case of the pFET when a spacer with intrinsically compressive stress is used the stress states would then reverse as compared to FIG. 3, however, the shape of the stress contours would remain the same. The compression needed in the longitudinal direction for the pFET is thus obtained with negligible compressive stresses in the transverse direction.

Before we get into a deeper description of the process and structure, we first examine the possible spacer materials for the nFET and pFET respectively. For instance nitride films can be readily modulated to have very high intrinsic stress ranging from tension to compression. For example, as shown in Ito et al (IEDM, 2000) the PECVD (Plasma Enhanced CVD) nitride etch stop film stress could be modulated (by changing the deposition conditions such as SiH4/N2/He flow rates, pressure, HF power, and electrode gap) between −1.4 GPa and +0.3 GPa. We have been able to replicate these stresses in our nitrides by modulating deposition conditions and have been able to create −1.4 GPa to +0.4 GPa intrinsic stresses in the nitride, as measured with wafer curvature techniques. LPCVD nitrides have been known to create tensile stresses up to 1.4 GPa. HDP oxide is known to induce compressive stresses while TEOS can impose tension. The following are example conditions that may be used to generate compressive SiN by PECVD. Standard parameters for Plasma RF power are 300 Watts, by increasing the power to 900 W, using a pressure of about 5.75 torr., at 480 C, and a spacing of about 395 mils, a film with compression of about −1.6 GPa is achieved. Conditions that may be used to generate tensile SiN films by PECVD: the power may be lowered to about 100 W, with the pressure at about 5.75 torr, and temperature of about 480 C to generate a film with about +400 MPa. The pressure may be increased from about from 5.75 torr. to 6.5 torr and the spacing may be increased to 490 mils from about 395 mils at a temperature of about 480 C to generate a film with about 500 MPa. The temperature may be lowered to 380 C to generate more tension in the film. Alternatively, a thermal CVD process may be used to generate a tensile film of about 1.4 GPa. Thus, materials are readily available to pick the correct stress for the spacer film.

Figure 4A:
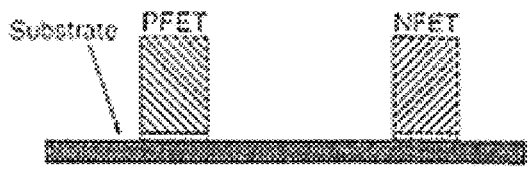
FIGS. 4a–b illustrate an exemplary inventive process for fabricating NFETs and PFETs on a common substrate each having stress inducing spacers thereon.
Figure 4A:
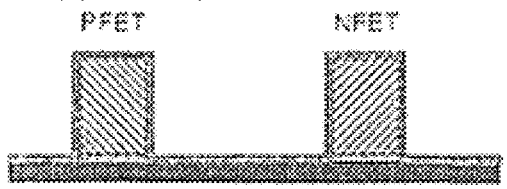
Figure 4A:
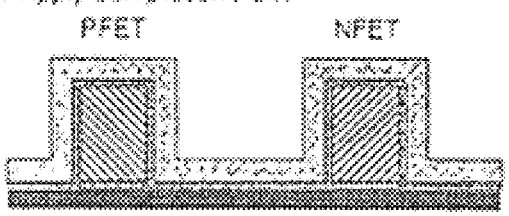
Figure 4A:
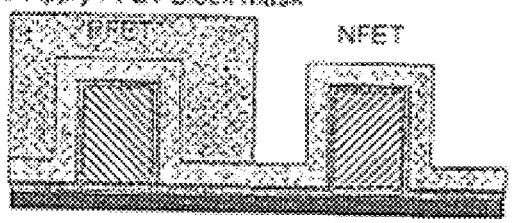
Figure 4A:
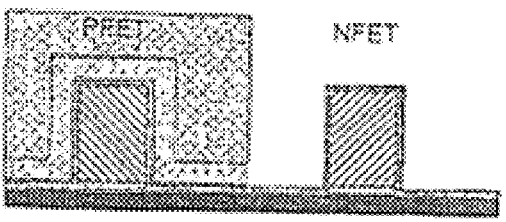
Figure 4A:
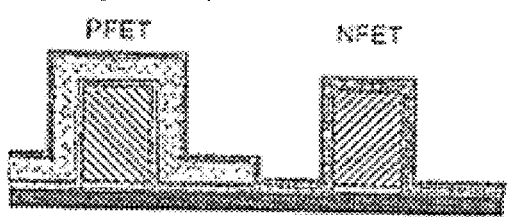
Figure 4B:
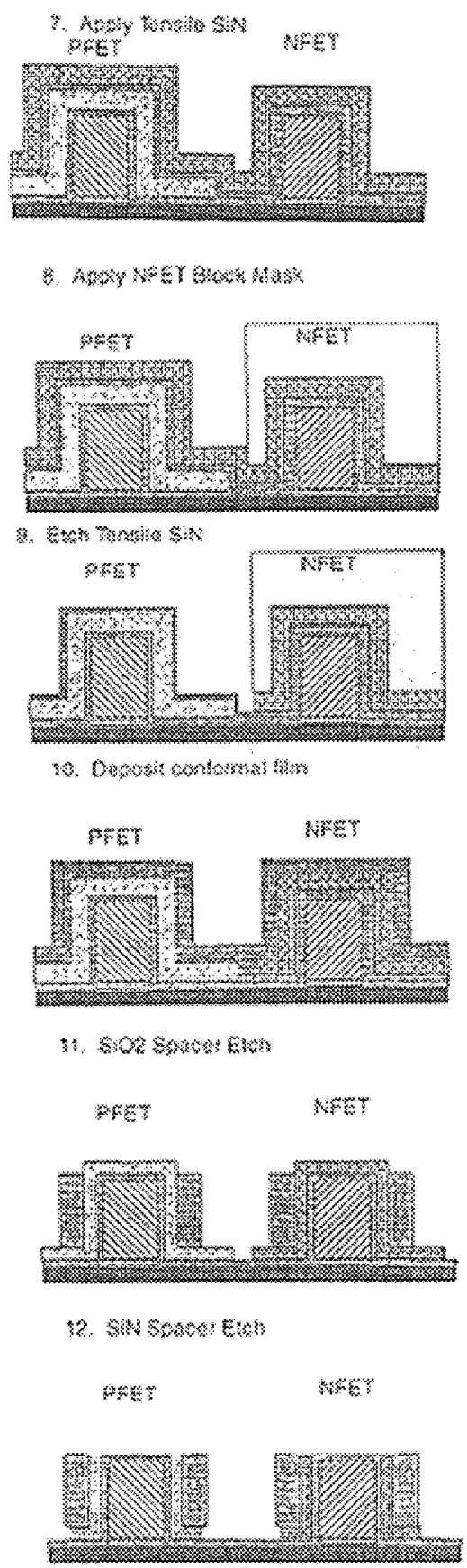

One example of the process steps by which we get the two separate and distinctly differently stressed spacers on the nFET and pFET, particularly from an intrinsic stress viewpoint, are given by steps 1–12 in FIGS. 4a–b (It is to be noted that the device regions and spacer regions in these figures are not drawn to scale in any dimension): Starting with conventional gate stack formation for both PFET and NFET (1), we applied conformal etch stop material over exposed surfaces (2) using, preferably a low temperature (380–480 C) oxide $SiO_2$. Next is a deposition of compressive SiN (3), as explained above (for negative stress values, e.g. −1.6 GPa), and a standard resist block mask over the PFET (4). The next step involves etching the SiN from the NFET (5); removing the block mask and depositing the conformal etch stop layer again (6). A tensile deposition of SiN follows (7), as explained above (for positive stress values, e.g. +500 MPa), then a standard resist block mask is patterned over the NFET (8). The tensile SiN is etched from the PFET (9) then the block mask is removed and a conformal oxide layer is deposited (10). A $SiO_2$ spacer etch is then used to shape the oxide spacer remaining on the SiN sidewall (11). Finally, a SiN etch forms the stress inducing spacers as illustrated in step 12. Step 12 leads to completely symmetric devices because the spacer etch leaves behind the same length of foot for the pFETs and nFETs on each side. Control of the foot length can modulate the stress to some extent.

Another embodiment of the present invention can be implemented using the process described above except that the known stress inducing materials HDP and TEOS are used. In this second embodiment, each of the conformal oxide layer depositions (2, 6, 10) are replaced with a nitride layer deposition, while the deposition of compressive nitride (3) is replaced with an HDP layer deposition, and the tensile nitride deposition (9) is replaced with a TEOS layer deposition.

Figure 5A:
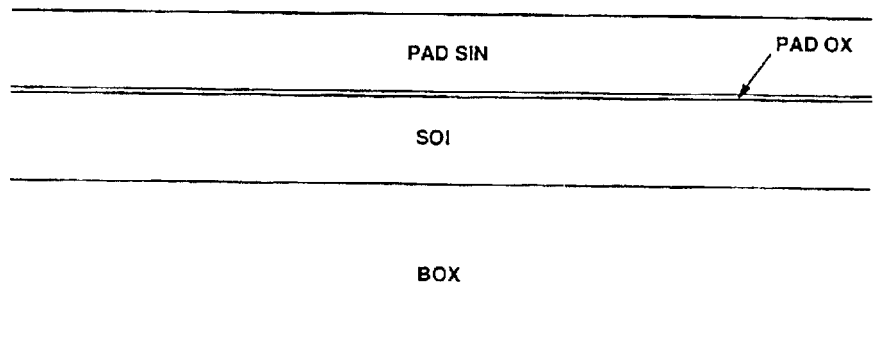
FIGS. 5a–g illustrate a third embodiment of the present invention.
Figure 5B:
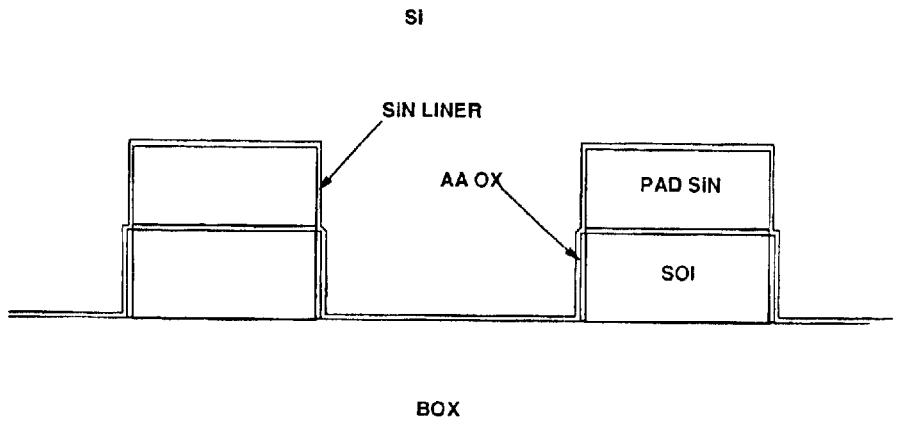
Figure 5C:
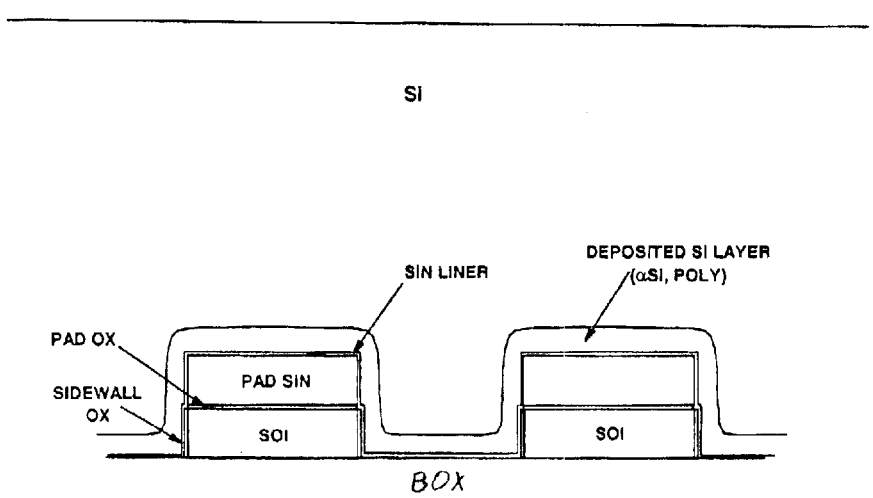
Figure 5D:
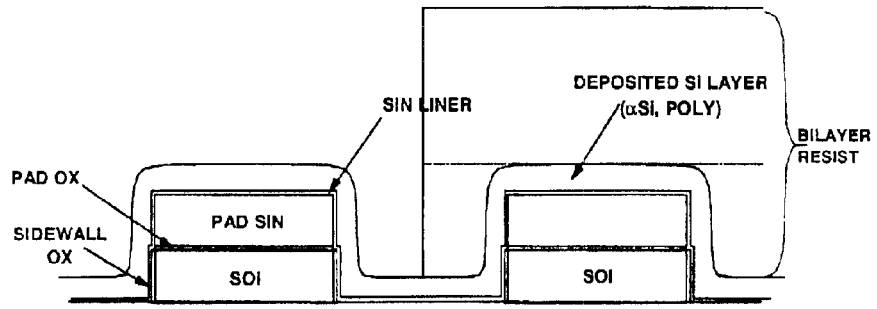
Figure 5E:
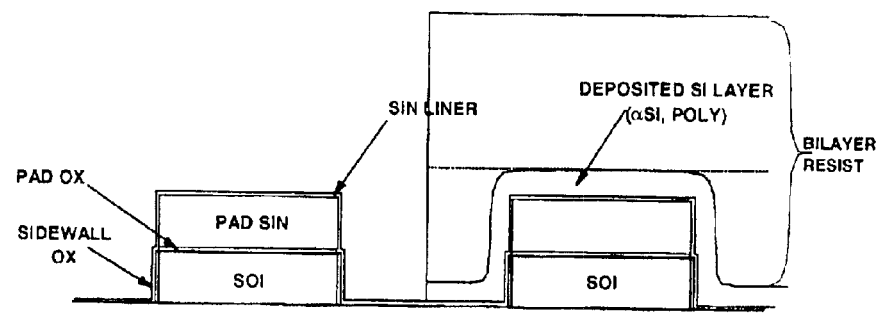
Figure 5F:
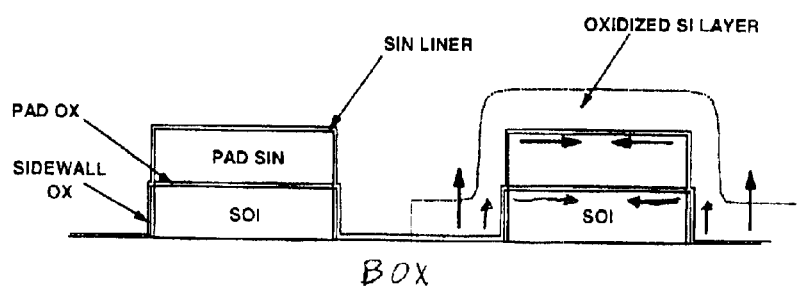
Figure 5G:
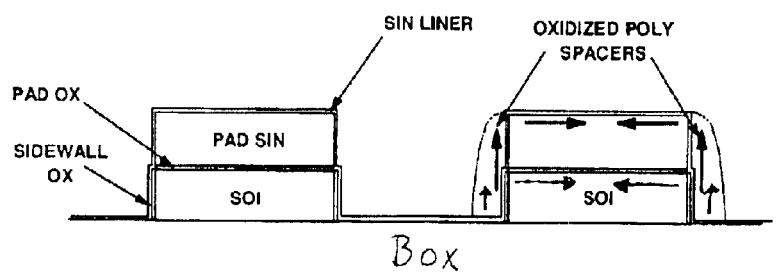
Figure 6:
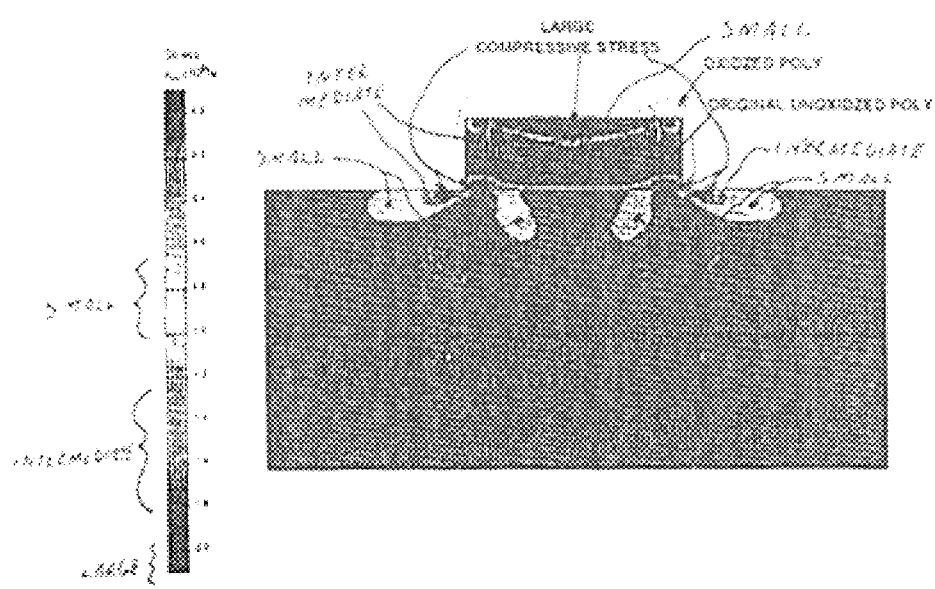
FIG. 6 illustrates a simulation of the compressive channel stress in a PFET of the third embodiment.

A third embodiment of the present invention is illustrated in FIGS. 5a–g, wherein a sidewall liner is defined selectively where compressive longitudinal stress is desired. FIG. 5a illustrates a starting structure formed with conventional processing of a standard wafer (SOI in this example). A thermal pad oxide and a deposited pad nitride are formed on the surface of the wafer using methods well known in the art. Next, shown in FIG. 5b, active areas (trench isolation) are patterned and etched to the BOX. An AA sidewall oxide is grown, and a thin SiN liner is deposited. FIG. 5c shows the next step wherein a thin amorphous or polysilicon layer is conformally deposited. Next, as shown in FIG. 5d, a bilayer resist is deposited and patterned, however, a single layer resist may be acceptable for shallow topography. Wherever enhanced stress is not desired, the exposed Si liner is selectively isotropically etched from those devices, as shown in FIG. 5e. Finally, as shown in FIG. 5f, the remaining bilayer resist is stripped, using well known methods. The Si liner is then oxidized at low-temperature, to minimize stress relief due to reflow. The volume expansion of the oxidized silicon induces a bending moment in the SOI island, represented by the upward and inward arrows in the Figure, resulting in a compressive stress at the surface of the SOI (where the device channel will be subsequently formed). Liner thickness can be varied to tune the magnitude of the stress. Alternatively, materials other than poly or amorphous silicon can be used for the liner, such as germanium doped silicon or silicon nitride. Also, deposition of an isolation material and planarization, which follows this oxidation step as described below, can precede the oxidation step. FIG. 6 shows the stress regions, indicated by shading, imposed on the SOI regions and in the Box layer, demonstrating the generation of a strong longitudinal compressive stress in the channel of the pMOSFET due to volume expansion of the oxidized poly spacers. The stress is well confined to the device of interest. The SOI thickness in this example is approximately 80 nm.

An alternative final step involves subjecting the silicon liner to a RIE etch to form spacers which are subsequently oxidized. This alternative process achieves similar bending moments in the SOI as illustrated in FIG. 5g. Normally practiced processing follows the structures of FIGS. 5f and 5g, which includes STI fill and planarization down to the SOI top surface, body doping implants, gate dielectric formation, gate conductor formation, source-drain implants, contacts, and various higher levels of metallurgy and interlayer dielectrics. These further processing steps are not considered part of the present invention and are not discussed further.

Figure 7A:
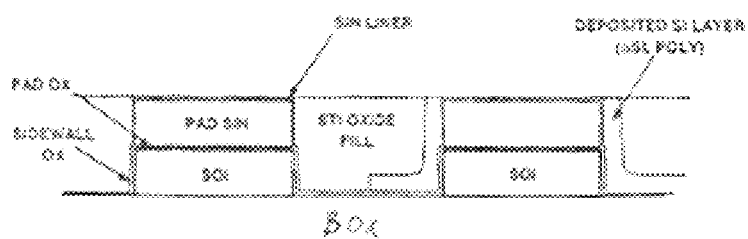
FIGS. 7a–b illustrate a fourth embodiment of the present invention.
Figure 7B:
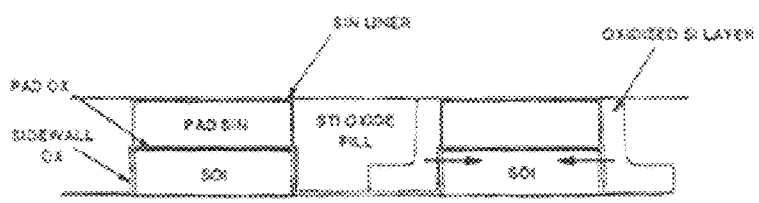
Figure 7C:
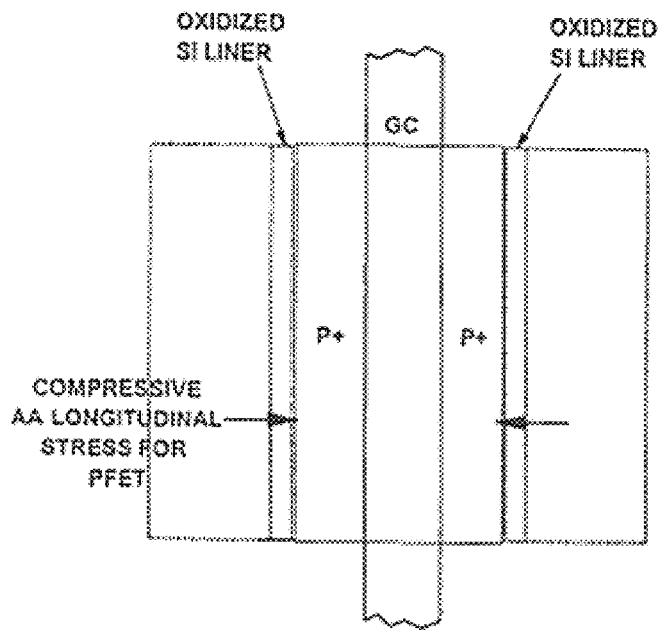
FIG. 7c illustrates a top view of a PFET formed according to the present invention.
Figure 8:
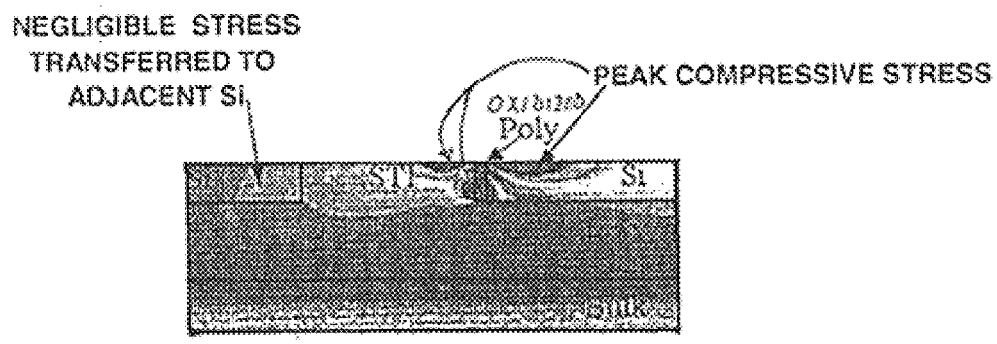
FIG. 8 illustrates a simulation of the compressive channel stress in a PFET of the fourth embodiment.

FIGS. 7a–b illustrate a fourth embodiment of the present invention, continuing from the previously described process at the step shown in FIG. 5e. This fourth embodiment comprises oxidation of the etched silicon liner (or spacer) after STI fill and planarization. Beginning with the structure shown in FIG. 5e, the resist layers are stripped and the isolation regions are filled with oxide and planarized by well known conventional methods, resulting in the structure shown in FIG. 7a. The oxide fill preferably comprises TEOS to facilitate diffusion of oxygen to the silicon liner. The remaining polysilicon liner regions are oxidized through the STI, creating a compressive stress in the SOI island, as illustrate by the inwardly pointing arrows in FIG. 7b. Various oxidation conditions, STI fill composition, and liner thickness can be employed to tune the magnitude of the stress. Alternatively, materials other than poly or amorphous silicon can be used for the liner, such as germanium doped silicon or silicon nitride. Standard processing continues from this point to completion of the chip. FIG. 7c shows a top view of the PFET, fabricated according to the methods just described, containing the oxidized liner, with the gate conductor (GC) over the channel region that is disposed between the diffusions (P+), and showing the direction of imposed longitudinal stress propagating through the channel region. FIG. 8 illustrates the compressive stress patterns in this embodiment showing that a large compressive stress is created in the SOI island in the direction of channel current. The peak compressive stress occurs near the top of the SOI layer adjacent the oxidized polysilicon. The lighter shades extending away from the peak compression regions indicate regions of dissipating stress. As can be seen in this figure, negligible propagation of stress to adjacent SOI island occurs. The SOI thickness is about 80 nm.

ADVANTAGES OVER THE PRIOR ART

One embodiment of the present invention involves forming spacers with different intrinsically stress inducing materials to impart selected longitudinal stress components upon active device regions formed in a substrate, in one embodiment. For example, using a stress inducing material that is intrinsically tensile causes a tensile state of stress in a desired substrate channel region and an intrinsically compressive material causes compression in the same substrate channel region. In order to impart these different stresses in devices, we use deposited films that impose different intrinsic stresses. For example, TEOS is tensile while HDP (high density plasma) is compressive. The key here is to integrate two different intrinsically stress inducing spacers adjacent the gates of the NFETs and PFETs or individually.

In the prior art, Rim et. al. apply biaxial tension in strained silicon using a SiGe relaxed sub-layer. The problems there are many. While the NFET shows what may be considered significant improvement, they could not simultaneously improve both devices. Also, since the requirement is a relaxed SiGe layer, misfit dislocations are needed at the SiGe/Si interface. One of the major mechanisms by which the misfit dislocations are formed is from threading dislocations. Unfortunately, the threading dislocations can cause significant reliability, yield, and major leakage issues and are difficult to remove in practice.

Mechanical Stress affect of Etch-Stop Nitride and its Impact on Deep Submicron Transistor Design, Ito et al (IEDM, 2000) impose stress using an etch-stop nitride superlayer that is deposited after the device is completely constructed. Again, here the films have a built-in intrinsic biaxial stress. They found that when the film is in compression NFET performance is degraded, while the PFET is enhanced. Also, they did not improve the performance of both the PFET and NFET simultaneously. Also, since the film is well above the device the stress translated down into the silicon will be somewhat lessened, particularly when compared to something that is directly adjacent the device.

The present solution shows how to apply the correct states of stress through modifying the sidewall spacer process to benefit both the NFET and PFET simultaneously. It also differs substantially from both of these other approaches since the tension and compression are achieved through spacer structures that are physically close to the affected device regions whereas the prior art listed above shows the stress is imposed through strained Si in one case and from intrinsic stress in a layer that comes well after the device build (and not adjacent the device as we do).

The advantages of the method of the preferred embodiment of this invention include: device performance improvements for NFETs, PFETs, and for both NFETs and PFETs simultaneously; a process readily integratible into present manufacturing processes for bulk silicon, silicon-on-insulator ("SOI"), and strained silicon structures; and improved devices be integrated into present processes cheaply for significant device performance improvements.

ALTERNATIVE EMBODIMENTS

It will be appreciated that, although specific embodiments of the invention have been described herein for purposes of illustration, various modifications may be made without departing from the spirit and scope of the invention. In particular, while nitride is a good material choice for the two spacers because the intrinsic stress can be controlled from tension to compression. While this above embodiment with nitride spacers is preferred, this approach is not restricted in material choice. One can have additional options in terms of the material set. HDP can be used for compressive stress while TEOS can be used for tension. The integration of these material choices causes changes in process flow.

Other spacer materials can be used, such as ceramics and silicon carbide, which can also impart intrinsic stresses. The general view of stresses in silicon is that it's disadvantageous. Stresses lead to ruptures or dislocations in the lattice structure, which lead to junction leakage, etc. In the present invention, we're intentionally building in a stress pattern.

Accordingly, the scope of protection of this invention is limited only by the following claims and their equivalents.

We claim:

1. A spacer structure for devices formed in a substrate, the devices including devices of a first conductivity type and devices of a second conductivity type, the devices each having a channel for conducting charge in a longitudinal direction and each having a gate terminal adjacent the channel, the structure comprising:

a first spacer structure for a first one of the devices of the first conductivity type, the first spacer structure comprising a first stress inducing material adjacent to both a sidewall of the first one of the device's gate terminal and its channel which applies a first type of mechanical stress on the first one of the devices at least in the longitudinal direction, the first type of mechanical stress being one of tensile stress and compressive stress; and a second spacer structure for a second one of the devices of the second conductivity type, the second spacer structure comprising a second stress inducing material adjacent to both a sidewall of the second one of the device's gate terminal and its channel which applies a second type of mechanical stress, different from the first type of mechanical stress, on the second one of the devices at least in the longitudinal direction, the second type of mechanical stress being the other of tensile stress and compressive stress, wherein the first one of the devices is an NFET and the second one of the devices is a PFET, and the first stress inducing material is a tensile deposited nitride and the second stress inducing material is a compressive deposited nitride.

* * * * *